United States Patent
Sakamoto

(10) Patent No.: US 6,614,073 B1
(45) Date of Patent: Sep. 2, 2003

(54) SEMICONDUCTOR CHIP WITH A BASE ELECTRODE AND AN EMITTER ELECTRODE EXPOSED ON ONE OF A PAIR OF OPPOSITE LATERAL FACES AND A COLLECTOR ELECTRODE EXPOSED ON A REMAINING ONE OF THE PAIR OF THE OPPOSITE LATERAL FACES

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/658,593

(22) Filed: Sep. 8, 2000

(30) Foreign Application Priority Data

Sep. 9, 1999 (JP) ............................................. 11-255882

(51) Int. Cl.[7] .......................... H01L 29/72; H01L 29/74; H01L 29/36; H01L 27/02
(52) U.S. Cl. ........................ 257/328; 257/329; 257/154; 257/175; 257/169; 257/133; 257/139; 257/583; 257/77; 257/521; 257/698; 257/696; 257/695
(58) Field of Search ................................. 257/734, 725, 257/724, 687, 678, 696, 693, 692, 691, 690, 698, 666, 528, 154, 175, 169, 133, 139, 329, 583, 77, 524

(56) References Cited

U.S. PATENT DOCUMENTS

| | | | |
|---|---|---|---|
| 4,547,791 A | * | 10/1985 | Roger et al. |
| 5,095,351 A | * | 3/1992 | Gotton |
| 5,393,678 A | * | 2/1995 | Ristic ........................... 324/252 |
| 5,424,563 A | * | 6/1995 | Temple et al. ................ 257/154 |
| 5,541,123 A | * | 7/1996 | Williams et al. |
| 5,557,134 A | * | 9/1996 | Sugisaka et al. .............. 257/506 |
| 5,640,040 A | * | 6/1997 | Nakagawa et al. ........... 257/487 |
| 5,654,561 A | * | 8/1997 | Watabe ......................... 257/139 |
| 5,750,000 A | * | 5/1998 | Yonehara et al. ............. 257/347 |
| 5,751,023 A | * | 5/1998 | Aono ............................ 257/138 |
| 5,828,100 A | * | 10/1998 | Tamba et al. ................. 257/328 |
| 6,022,757 A | * | 2/2000 | Andoh .......................... 438/106 |
| 6,104,078 A | * | 8/2000 | Iida et al. ..................... 257/524 |
| 6,118,141 A | * | 9/2000 | Xu et al. ...................... 257/133 |
| 6,329,675 B2 | * | 12/2001 | Singh et al. .................... 257/77 |
| 6,355,542 B1 | * | 3/2002 | Andoh .......................... 438/460 |
| 6,404,037 B1 | * | 6/2002 | Finney ......................... 257/583 |
| 2001/0031521 A1 | * | 10/2001 | Pan et al. ..................... 438/197 |
| 2002/0053696 A1 | * | 5/2002 | Iwamuro et al. ............. 257/329 |

* cited by examiner

Primary Examiner—Alexander O. Williams
(74) Attorney, Agent, or Firm—Rabin & Berdo, P.C.

(57) ABSTRACT

A semiconductor chip provided, at a lateral face thereof, with an electrode for external electric connection. Where a semiconductor chip has a plurality of electrodes, all the electrodes are preferably formed at one or more lateral faces of the semiconductor chip. Each electrode is preferably embedded in a groove which is formed in a lateral face of the semiconductor chip and which is opened laterally of the semiconductor chip. The semiconductor chip may be a discrete bipolar transistor element. In this case, each of the base electrode, the emitter electrode and the collector electrode is preferably formed at a lateral face of the semiconductor chip.

14 Claims, 5 Drawing Sheets

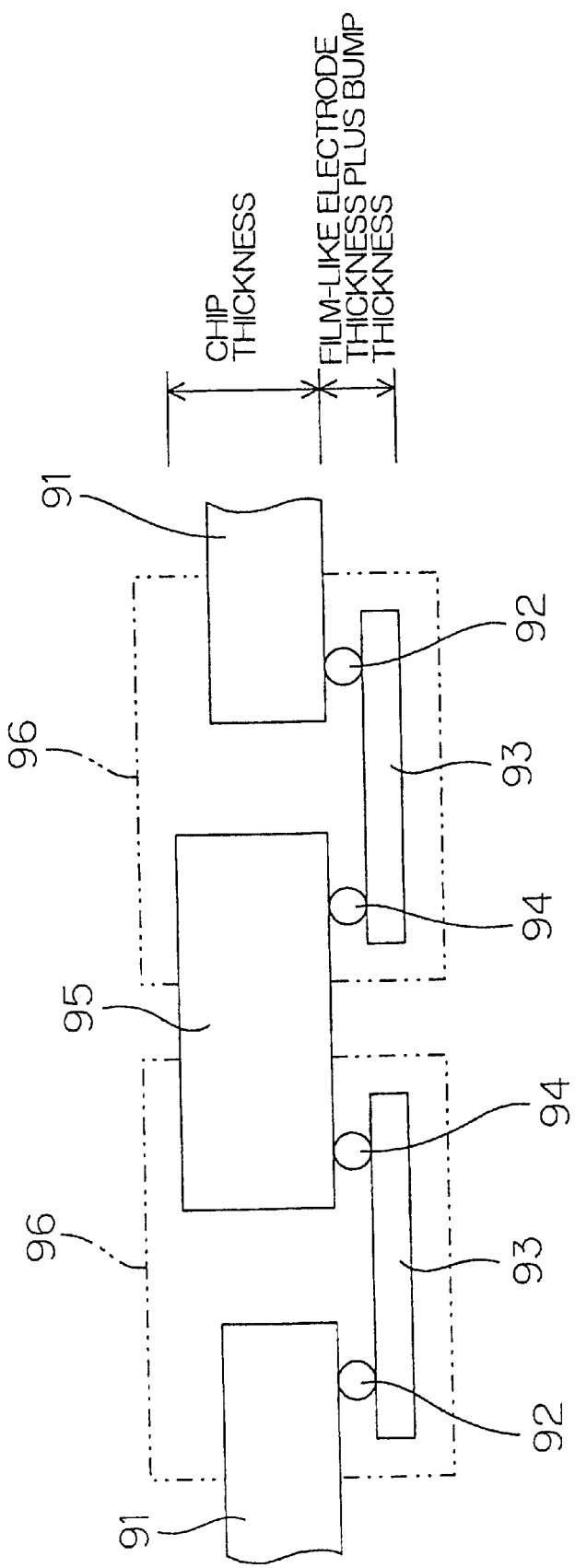

SEMICONDUCTOR CHIP WITH A BASE ELECTRODE AND AN EMITTER ELECTRODE EXPOSED ON ONE OF A PAIR OF OPPOSITE LATERAL FACES AND A COLLECTOR ELECTRODE EXPOSED ON A REMAINING ONE OF THE PAIR OF THE OPPOSITE LATERAL FACES

BACKGROUND OF THE INVENTION

1. Field of the Invention

The present invention relates to a semiconductor chip and a thin-type semiconductor device using the same.

2. Description of Related Art

To produce a thinner semiconductor device, studies have recently been made on a package having a thickness substantially equal to that of a semiconductor chip (chip thickness package)

FIG. 5 is a side view schematically illustrating a conventionally proposed arrangement to achieve a chip thickness package. In this conventionally proposed arrangement, film-like electrodes 93 are connected to the undersides of lead frames 91 through bumps 92. A semiconductor chip 95 having bumps 94 on its face at the active-surface-layer-area side, is connected to the film-like electrodes 93 through the bumps 94 with the face at the active-surface-layer-area side being opposite to the tops of the film-like electrodes 93. The connection part between each lead frame 91 and each film-like electrode 93 and the connection part between each film-like electrode 93 and the semiconductor chip 95, are sealed as wholly covered with resin 96 to prevent separation from each other.

According to the arrangement above-mentioned, however, each of the film-like electrodes 93 and the bumps 92, 94 has a thickness of about 20~30 μm. This accordingly increases the semiconductor device in thickness. It is therefore impossible to achieve a chip thickness package having a thickness substantially equal to that of the semiconductor chip 95.

SUMMARY OF THE INVENTION

It is an object of the present invention to provide a semiconductor chip which makes it possible to achieve a chip thickness package, and also to provide a semiconductor device formed with the use of such a semiconductor chip.

According to the present invention, a semiconductor chip is provided at a lateral face thereof with an electrode for external electric connection.

When the semiconductor chip has a plurality of electrodes, each of these electrodes preferably formed at a lateral face of the semiconductor chip.

The lateral face refers to an outer face extending along the thickness direction of the semiconductor chip.

According to the present invention, each electrode is formed at a lateral face of a semiconductor chip. Accordingly, a power supply or signal wire (bonding wire) to be connected to each electrode can be connected laterally of the semiconductor chip. This eliminates the need to dispose, on a surface of the semiconductor chip, a bump or the like for external electric connection. Therefore, a semiconductor device formed with the use of this semiconductor chip is made in the form of a chip thickness package having a thickness substantially equal to that of the semiconductor chip.

Each electrode is preferably embedded in a groove which is formed in a lateral face of the semiconductor chip and which is opened laterally of the semiconductor chip. This arrangement can reduce the semiconductor chip in size in plan view, thus achieving further miniaturization of the semiconductor device.

When the semiconductor chip is a discrete device comprising a bipolar transistor, the collector electrode is preferably formed at a lateral face of the semiconductor chip. Further, all the base electrode, the emitter electrode and the collector electrode are preferably formed at one or more lateral faces of the semiconductor chip. More preferably, all the electrodes are formed at (preferably, exposed to) the side of the same surface (outer surface at a right angle to the thickness direction of the semiconductor chip) of the semiconductor chip.

The collector electrode of a conventional bipolar transistor is formed in a collector area formed at the underside of the semiconductor chip. Accordingly, a collector frame is present at the underside of the semiconductor chip. This prevents the thickness of the semiconductor device from being made substantially equal to that of the semiconductor chip. On the contrary, when the collector electrode is formed at a lateral face of the semiconductor chip, the collector frame can be connected to the collector electrode laterally of the semiconductor chip, thus eliminating the need to extend the collector frame to the underside of the semiconductor chip. This achieves a chip thickness package having a thickness substantially equal to that of the semiconductor chip.

According to the present invention, a semiconductor device comprises a semiconductor chip having the characteristics above-mentioned, and a power supply or signal wire connected, laterally of the semiconductor chip, to each electrode.

These and other features, objects and advantages of the present invention will be more fully apparent from the following detailed description set forth below when taken in conjunction with the accompanying drawings.

BRIEF DESCRIPTION OF THE DRAWINGS

FIG. 5 is a side view schematically illustrating the arrangement of a conventional semiconductor device proposed to achieve a chip thickness package.

DESCRIPTION OF THE PREFERRED EMBODIMENTS

Figure 1:
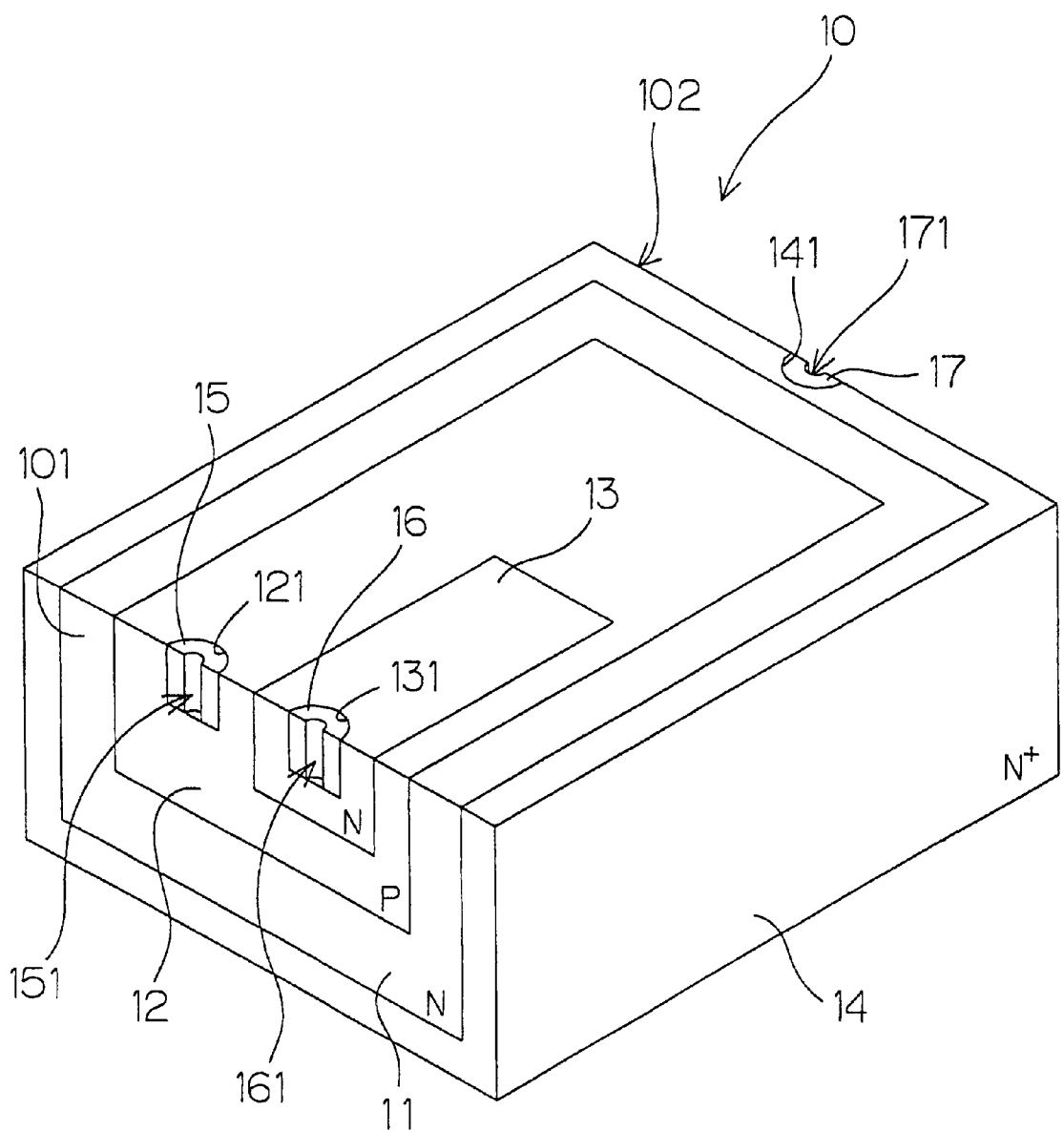
FIG. 1 is a perspective view illustrating the arrangement of a semiconductor chip according to an embodiment of the present invention.

FIG. 1 is a perspective view illustrating the arrangement of a semiconductor chip according to an embodiment of the present invention. This semiconductor chip 10 is a discrete device comprising an NPN-structure bipolar transistor. For example, the semiconductor chip 10 has a P-type base area 12 on the surface of an N-type semiconductor substrate 11, and an N-type emitter area 13 within the P-type base area 12. A collector area 14 is formed at the underside and three lateral faces of the N-type semiconductor substrate 11.

The base area 12, the emitter area 13 and the collector area 14 have grooves 121, 131, 141 at the side of the surface of the semiconductor chip 10. The grooves 121, 131 are laterally opened in that lateral face 101 of the N-type semiconductor substrate 11 (semiconductor chip 10) where the collector area 14 is not being formed. A base electrode 15 and an emitter electrode 16 are respectively embedded in the grooves 121, 131. The groove 141 formed in the collector area 14 is opened in a lateral face 102 opposite to the lateral face 101 of the semiconductor chip 10. A collector electrode 17 is embedded in the groove 141. The base electrode 15, the emitter electrode 16 and the collector electrode 17 have wire connection recesses 151, 161, 171, respectively.

Figure 2:
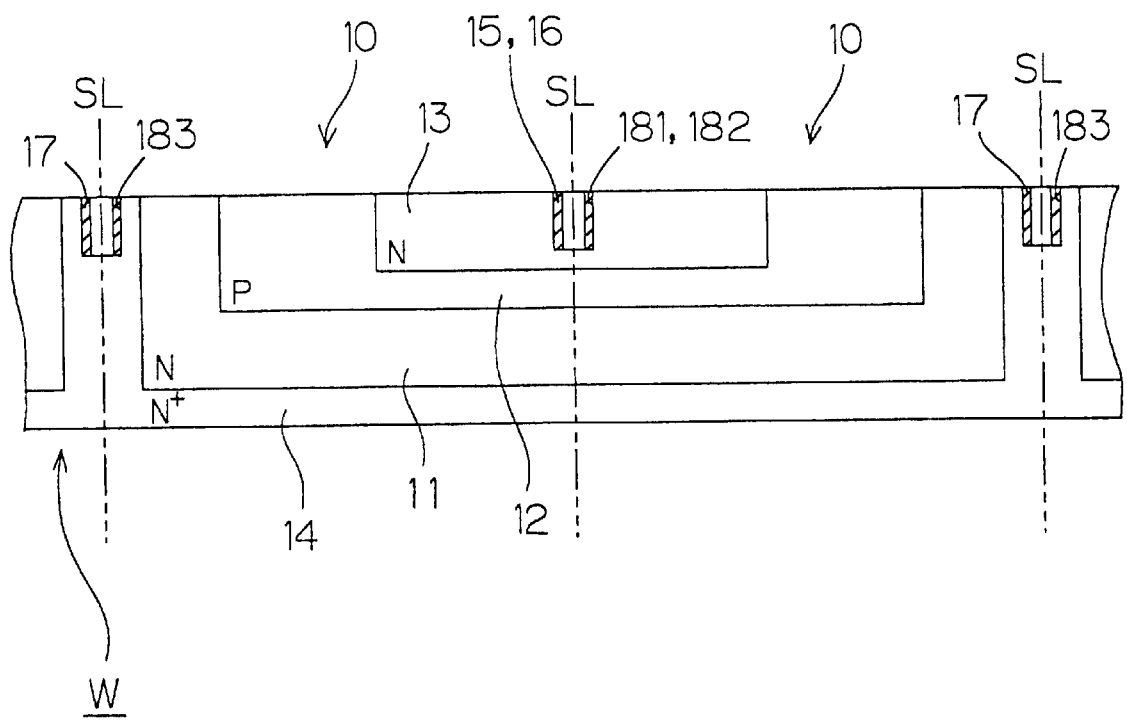
FIG. 2 is a section view illustrating a semiconductor chip producing process.

As shown in FIG. 2, the base electrode 15, the emitter electrode 16 and the collector electrode 17 are formed at the stage of a semiconductor wafer W. More specifically, prior to the step of cutting the semiconductor wafer W along scribe lines SL to produce individual semiconductor chips 10, a resist film is pattern-formed on the surface of the semiconductor wafer W, and etching is conducted with this resist film serving as a mask. This forms electrode forming concaves 181, 182, 183 on the scribe lines SL. That is, the concaves 181, 182 for forming the base electrode and the emitter electrode, are formed on the scribe line SL passing through both the base area 12 and the emitter area 13. The collector electrode forming concaves 183 are formed on those scribe lines SL passing through only the collector area 14, which are parallel to the scribe line SL passing through both the base area 12 and the emitter area 13.

An electrode material having electrical conductivity is embedded in each of the electrode forming concaves 181, 182, 183 thus formed, and the resist film formed on the surface of the semiconductor wafer W is then removed. There is formed, on the surface of the semiconductor wafer W, a second resist film having, in the areas opposite to the electrode forming concaves 181, 182, 183, openings smaller than the concaves 181, 182, 183 in plan elevation. With this second resist film serving as a mask, the electrode materials embedded in the electrode forming concaves 181, 182, 183 are etched.

Thereafter, the semiconductor wafer W is cut along the scribe lines SL to produce individual semiconductor chips 10. Each of the electrode forming concaves 181, 182 is divided into two parts. As shown in FIG. 1, there are formed the grooves 121, 131 laterally opened in the lateral face 101 of the semiconductor chip 10, and there are obtained the base electrode 15 and the emitter electrode 16 respectively embedded in the grooves 121, 131. Further, each electrode forming concave 183 is divided into two parts. As shown in FIG. 1, there is formed the groove 141 laterally opened in the lateral face 102 of the semiconductor chip 10 and there is obtained the collector electrode 17 embedded in the groove 141.

Figure 3:
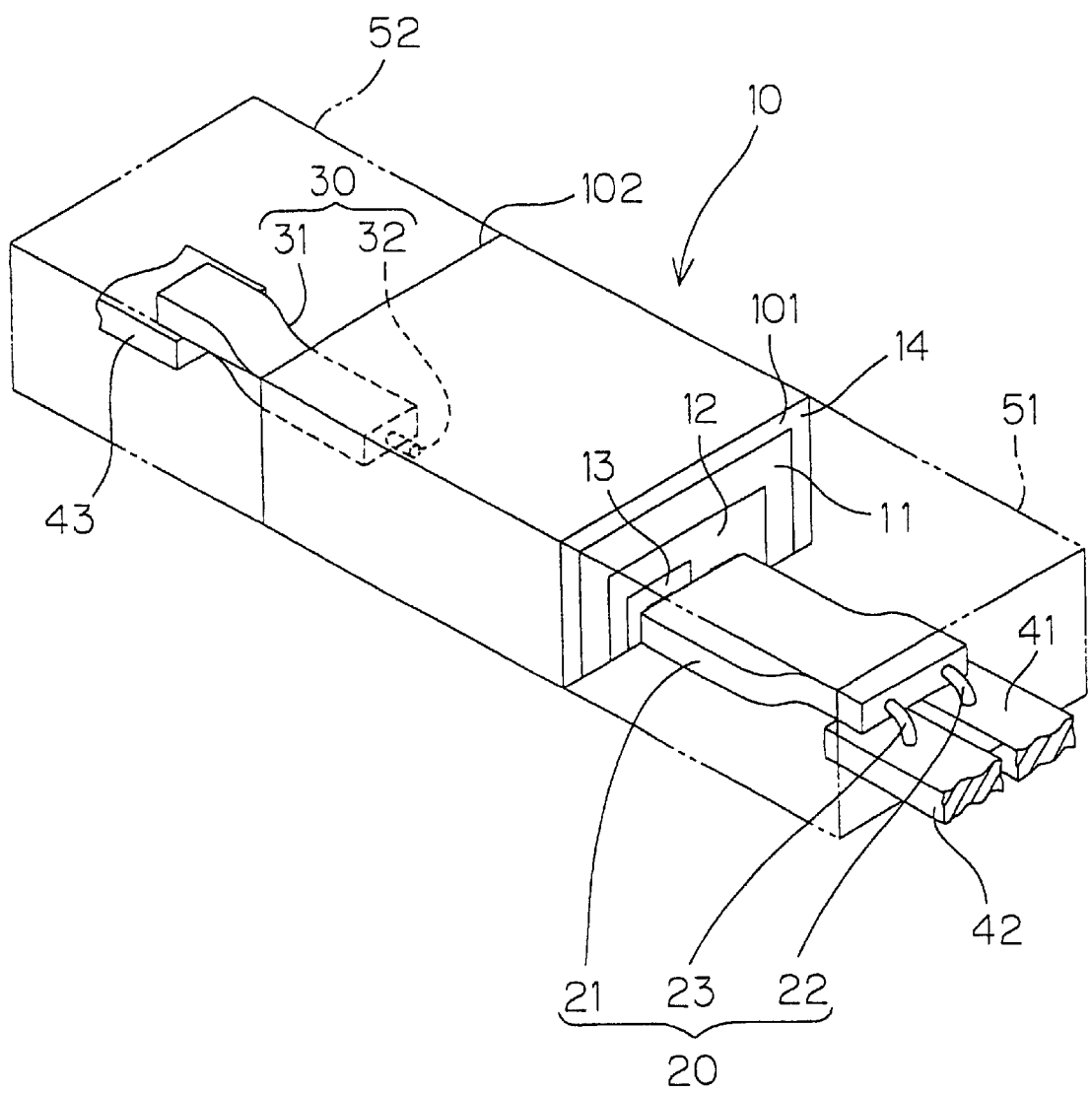
FIG. 3 is a perspective view illustrating a semiconductor device using the semiconductor chip shown in FIG. 1.
Figure 4:
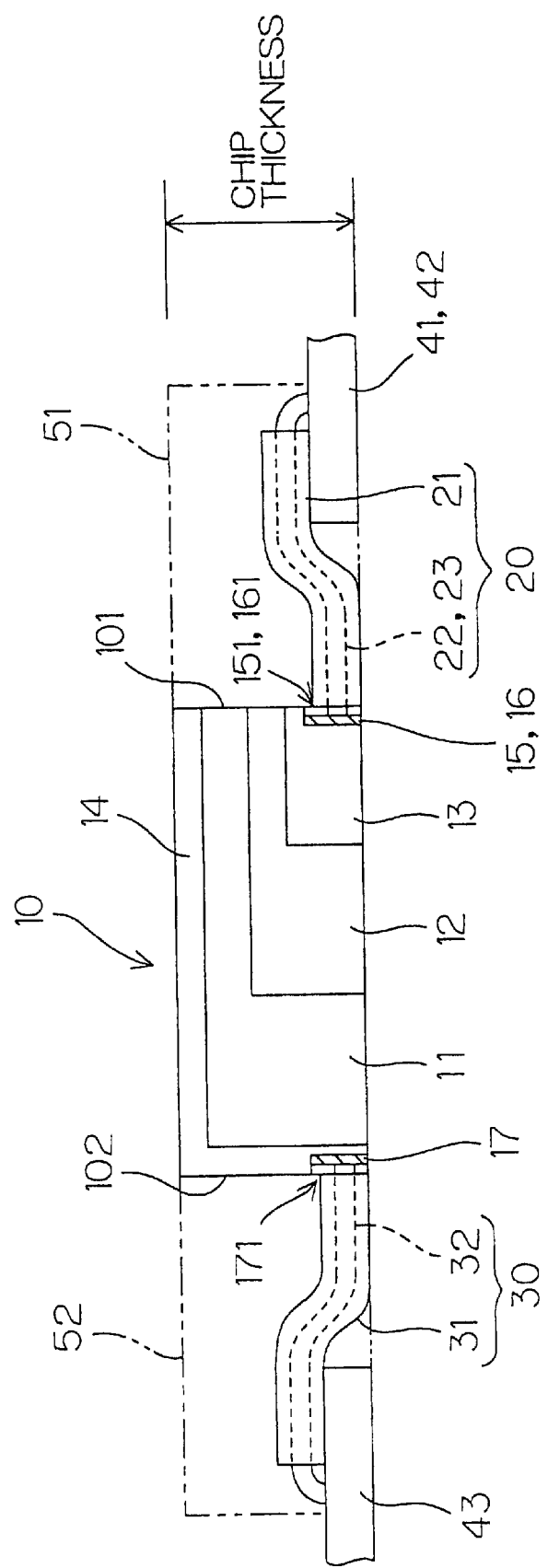
FIG. 4 is a section view of the semiconductor device shown in FIG. 3.

FIG. 3 is a perspective view of a semiconductor device using the semiconductor chip 10, and FIG. 4 is a section view thereof. In a face-down manner with the surface turned down, the semiconductor chip 10 is bonded, through film structure bodies 20, 30, to a frame having a plurality of lead electrodes 41, 42, 43 . . . . More specifically, provision is made such that the surface of the semiconductor chip 10 is substantially flush with the undersides of the lead electrodes 41, 42, 43 . . . . The base electrode 15 and the emitter electrode 16 formed at the lateral face 101 of the semiconductor chip 10, are connected to the tops of the lead electrodes 41, 42 through the film structure body 20. The collector electrode 17 formed at the lateral face 102 of the semiconductor chip 10 is connected to the top of the lead electrode 43 through the film structure body 30.

The film structure body 20 comprises a resin film 21 made of polyimide for example, a base wire 22 and an emitter wire 23, the resin film 21 covering the base wire 22 and the emitter wire 23. Both ends of each of the base wire 22 and the emitter wire 23 project from the resin film 21. One ends thus projecting are respectively connected to the lead electrodes 41, 42. The other end of the base wire 22 projecting from the resin film 21 is inserted, laterally of the semiconductor chip 10, into the wire connection recess 151 formed at the base electrode 15 of the semiconductor chip 10. This achieves electric connection between the base electrode 15 and the lead electrode 41. The other end of the emitter wire 23 projecting from the resin film 21 is inserted, laterally of the semiconductor chip 10, into the wire connection recess 161 formed at the base electrode 16 of the semiconductor chip 10. This achieves electric connection between the base electrode 16 and the lead electrode 42.

The film structure body 30 comprises a resin film 31 made of polyimide for example, and a collector wire 32 covered therewith. Both ends of the collector wire 32 project from the resin film 31. One end thus projecting is connected to the lead electrode 43. The other end of the collector wire 32 projecting from the resin film 31, is inserted, laterally of the semiconductor chip 10, into the wire connection recess 171 formed at the collector electrode 17 of the semiconductor chip 10. This achieves electric connection between the collector electrode 17 and the lead electrode 43.

A resin package 51 is formed as adhering to the lateral face 101 of the semiconductor chip 10. Housed in this resin package 51 are the film structure body 20 and the connection part between the lead electrodes 41, 42 and the film structure body 20. This prevents the film structure body 20 from coming off from the semiconductor chip 10 and the lead electrodes 41, 42. A resin package 52 is formed as adhering to the lateral face 102 of the semiconductor chip 10. Housed in this resin package 52 are the film structure body 30 and the connection part between the lead electrode 43 and the film structure body 30. This prevents the film structure body 30 from coming off from the semiconductor chip 10 and the lead electrode 43. Each of the resin packages 51, 52 has a thickness substantially equal to or not greater than that of the semiconductor chip 10.

In the semiconductor device having the arrangement above-mentioned, the base wire 22, the emitter wire 23 and the collector wire 32 are respectively connected, laterally of the semiconductor chip 10, to the base electrode 15, the emitter electrode 16 and the collector electrode 17 which are formed at lateral faces of the semiconductor chip 10. More specifically, nothing is present on the surface and the underside of the semiconductor chip 10. This achieves a chip thickness package having a thickness substantially equal to that of the semiconductor chip 10.

The foregoing has discussed embodiments of the present invention, but the present invention can be embodied in other form, too. For example, each embodiment above-mentioned is arranged such that each electrode is embedded in a groove formed in a lateral face of a semiconductor device. However, when forming each electrode after an individual semiconductor chip has been produced as cut out from a semiconductor wafer, each electrode may be formed as projecting from a lateral face of the semiconductor chip.

In each embodiment above-mentioned, the semiconductor chip is defined as a discrete device comprising a bipolar transistor. However, the semiconductor chip may be a discrete device comprising a transistor of other type such as a field-effect transistor or the like, or a discrete device comprising a circuit element such as a diode, other than a transistor, or an integrated circuit chip comprising a plurality of circuit elements.

The connection between the semiconductor chip and each lead electrode may be achieved by other means than a film structure body.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application claims conventional benefits of Japanese Patent Application Serial No. 11-255882, filed on Sep. 9$^{th}$ 1999, the disclosure of which is incorporated herein by reference.

I claim:

1. A semiconductor chip having a top surface and a bottom surface, the semiconductor chip comprising:
   a base electrode;
   an emitter electrode;
   a collector electrode; and
   an external electrode for external electric connection, the external electrode being provided at a lateral face forming a connecting surface connecting the top surface and bottom surface in a thickness direction of the semiconductor chip and the base electrode, the emitter electrode and the collector electrode being formed at a pair of opposite lateral faces of the semiconductor chip, wherein the base electrode and the emitter electrode are exposed on one of the pair of the opposite lateral faces and the collector electrode is exposed on a remaining one of the pair of the opposite lateral faces.

2. A semiconductor chip according to claim 1, having a plurality of electrodes each of which is formed at a lateral face of said semiconductor chip.

3. A semiconductor chip according to claim 1, wherein said each electrode is embedded in a groove which is formed in a lateral face of said semiconductor chip and which is opened laterally of said semiconductor chip.

4. A semiconductor chip according to claim 1, wherein said semiconductor chip is a discrete bipolar transistor element, of which the collector electrode is formed at one of the lateral faces of said semiconductor chip.

5. A semiconductor chip according to claim 4, wherein each of a base area, an emitter area and a collector area is exposed to a lateral face of said semiconductor chip.

6. A semiconductor chip according to claim 1, wherein said each electrode has a recess to which a power supply or signal wire is to be connected.

7. A semiconductor device having a top surface and a bottom surface, the semiconductor chip comprising:
   a semiconductor chip, having a base electrode, an emitter electrode a collector electrode and an external electrode for external electric connection, the external electrode being provided at a lateral face forming a connecting surface connecting the top surface and bottom surface in a thickness direction of the semiconductor chip and the base electrode, the emitter electrode and the collector electrode being formed at a pair of opposite lateral faces of the semiconductor chip; and
   a power supply or signal wire connected, laterally of said semiconductor chip, to said electrode, wherein the base electrode and the emitter electrode are exposed on one of the pair of the opposite lateral faces and the collector electrode is exposed on a remaining one of the pair of the opposite lateral faces.

8. A semiconductor device according to claim 7, wherein said semiconductor chip has a plurality of electrodes each of which is formed at a lateral face of said semiconductor chip.

9. A semiconductor device according to claim 7, wherein said each electrode is embedded in a groove which is formed in a lateral face of said semiconductor chip and which is opened laterally of said semiconductor chip.

10. A semiconductor device according to claim 7, wherein said semiconductor chip is discrete bipolar transistor element, of which the collector electrode is formed at one of the faces of said semiconductor chip.

11. A semiconductor dvice according to claim 10, wherein each of abase area, a emitter area and a collector area is exposed to a lateral face of said semiconductor chip.

12. A semiconductor device according to claim 7, wherein said each electrode has a recess to which the power supply or signal wire is to be connected.

13. A semiconductor chip according to claim 6, wherein the recess is opened laterally of the semiconductor chip and is capable of being laterally connected to a power supply or signal wire of the semiconductor chip.

14. A semiconductor chip according to claim 12, wherein the recess is opened laterally of the semiconductor chip and is capable of being laterally connected to a power supply or signal wire of the semiconductor chip.

* * * * *